United States Patent
Jung

(10) Patent No.: US 11,476,253 B2
(45) Date of Patent: Oct. 18, 2022

(54) SEMICONDUCTOR MEMORY DEVICE INCLUDING A MULTI-LAYER ELECTRODE

(71) Applicant: Samsung Electronics Co., Ltd., Suwon-si (KR)

(72) Inventor: Kyooho Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/029,238

(22) Filed: Sep. 23, 2020

(65) Prior Publication Data

US 2021/0257367 A1    Aug. 19, 2021

(30) Foreign Application Priority Data

Feb. 14, 2020    (KR) .................. 10-2020-0018102

(51) Int. Cl.
*H01L 27/108*    (2006.01)
*H01L 49/02*    (2006.01)

(52) U.S. Cl.
CPC ........ *H01L 27/10805* (2013.01); *H01L 28/55* (2013.01); *H01L 28/65* (2013.01)

(58) Field of Classification Search
CPC ... H01L 27/10805; H01L 28/55; H01L 28/65; H01L 27/10814; H01L 28/75; H01L 27/10852; H01L 27/10808; H01L 27/1085; H01L 28/40
USPC ....................................................... 257/296
See application file for complete search history.

(56) References Cited

U.S. PATENT DOCUMENTS

| 6,333,537 | B1 | 12/2001 | Arita |
| 8,159,016 | B2 | 4/2012 | Park et al. |
| 8,969,169 | B1* | 3/2015 | Chen .................. H01L 28/82 438/396 |
| 9,111,681 | B2 | 8/2015 | Saita et al. |
| 2004/0135189 | A1 | 7/2004 | Kiyotoshi |
| 2006/0214204 | A1* | 9/2006 | Yoo .................. H01L 27/11502 257/295 |
| 2008/0123243 | A1* | 5/2008 | Hamada .................. H01G 4/33 361/301.1 |
| 2011/0287270 | A1* | 11/2011 | Tsurumi ................. C25D 5/617 428/457 |
| 2013/0143379 | A1* | 6/2013 | Malholtra ......... H01L 21/02192 438/381 |
| 2014/0183696 | A1* | 7/2014 | Rui ......................... H01L 28/75 257/532 |

(Continued)

FOREIGN PATENT DOCUMENTS

| JP | 3209175 B2 | 9/2001 |
| KR | 100585003 B1 | 5/2006 |

(Continued)

*Primary Examiner* — Duy T Nguyen
(74) *Attorney, Agent, or Firm* — Myers Bigel, P.A.

(57) ABSTRACT

A semiconductor memory device includes a capacitor on a substrate. The capacitor includes a first electrode, a second electrode on the first electrode, and a dielectric layer between the first electrode and the second electrode. The second electrode includes a first layer, a second layer, and a third layer. The first layer is adjacent to the dielectric layer, and the third layer is spaced apart from the first layer with the second layer interposed therebetween. A concentration of nickel in the third layer is higher than a concentration of nickel in the first layer.

20 Claims, 6 Drawing Sheets

(56) References Cited

U.S. PATENT DOCUMENTS

2015/0137315 A1\* 5/2015 Chen .................. H01L 27/108
　　　　　　　　　　　　　　　　　　　　　　257/532

FOREIGN PATENT DOCUMENTS

KR　　1020070066458 A　　6/2007
KR　　　100555445 B1　　8/2007

\* cited by examiner

SEMICONDUCTOR MEMORY DEVICE INCLUDING A MULTI-LAYER ELECTRODE

CROSS-REFERENCE TO RELATED APPLICATION

This U.S. non-provisional patent application claims priority under 35 U.S.C. § 119 to Korean Patent Application No. 10-2020-0018102, filed on Feb. 14, 2020, in the Korean Intellectual Property Office, the disclosure of which is hereby incorporated by reference in its entirety.

BACKGROUND

Embodiments of the inventive concepts relate to a semiconductor memory device.

Semiconductor devices are widely used in an electronic industry because of their small sizes, multi-functional characteristics, and/or low manufacturing costs. However, semiconductor devices have become more highly integrated with the development of the electronic industry. Widths of patterns included in semiconductor devices have been reduced to increase the integration density of semiconductor devices. In particular, reduction of leakage current of a capacitor may be required to increase the integration density of a semiconductor memory device such as DRAM.

SUMMARY

Embodiments of the inventive concepts may provide a semiconductor memory device with improved reliability.

In some embodiments, a semiconductor memory device may include a capacitor on a substrate. The capacitor may include a first electrode, a second electrode on the first electrode, the second electrode including a first layer, a second, layer, and a third layer, and a dielectric layer between the first electrode and the second electrode. The first layer may be adjacent to the dielectric layer, and the third layer may be spaced apart from the first layer with the second layer interposed therebetween. A concentration of nickel in the third layer may be higher than a concentration of nickel in the first layer.

In some embodiments, a semiconductor memory device may include a capacitor on a substrate. The capacitor may include a first electrode, a second electrode on the first electrode, the second electrode including a first layer including an A-metal and nitrogen, a second layer, and a third layer including a B-metal, and a dielectric layer between the first electrode and the second electrode. The first layer may be adjacent to the dielectric layer, and the third layer may be spaced apart from the first layer with the second layer interposed therebetween. A work function of the B-metal may be greater than a work function of a nitride of the A-metal.

In some embodiments, a semiconductor memory device may include a substrate, transistors on the substrate, lower electrodes on the transistors, a support pattern in physical contact with sidewalls of the lower electrodes, a dielectric layer on surfaces of the lower electrodes and a surface of the support pattern, and an upper electrode on the dielectric layer. Each of the lower electrodes may include an A-metal nitride. The upper electrode may include an A-metal, nitrogen, and a B-metal.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, embodiments of the inventive concepts will be described in more detail with reference to the accompanying drawings.

Figure 1:
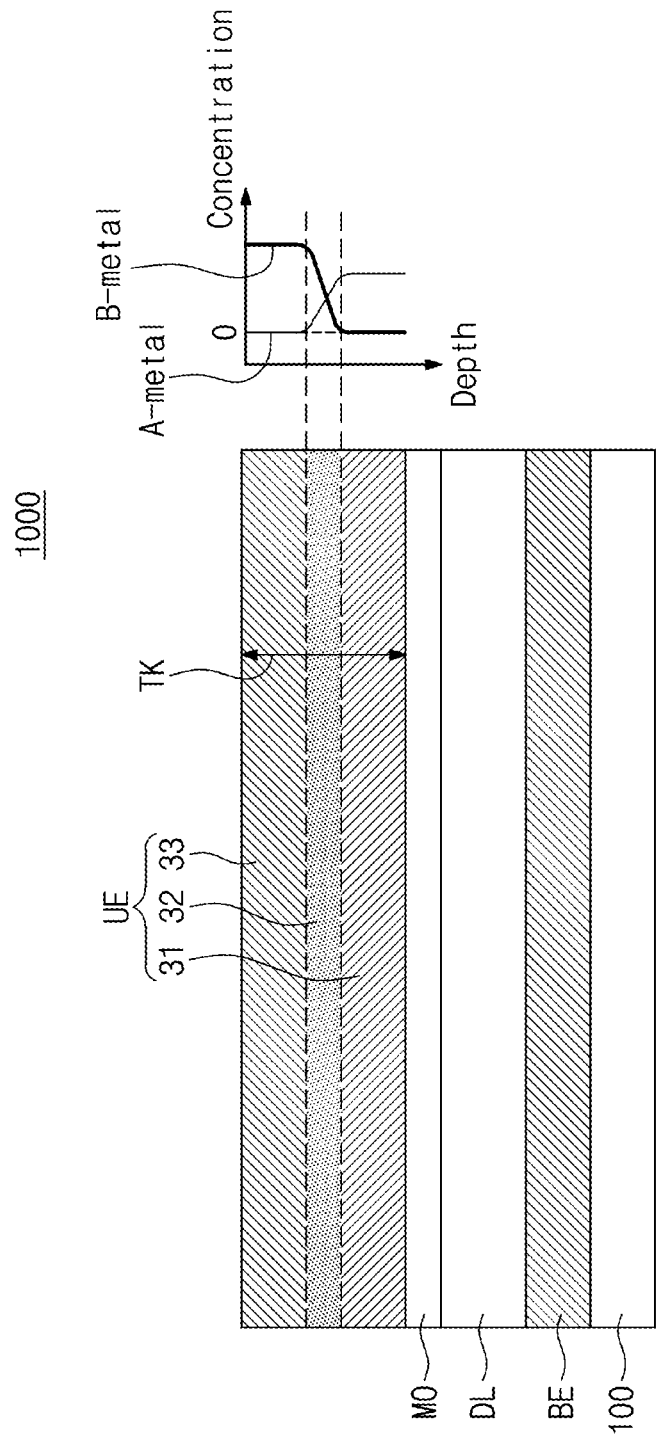
FIG. 1 is a cross-sectional view illustrating a semiconductor memory device according to some embodiments of the inventive concept.

FIG. 1 is a cross-sectional view illustrating a semiconductor memory device according to some embodiments of the inventive concept.

Referring to FIG. 1, a semiconductor memory device 1000 according to some embodiments may include a first electrode BE, a second electrode UE, a dielectric layer DL, and a metal oxide layer MO, which are disposed or arranged on a substrate 100. The second electrode UE may be disposed or arranged on the first electrode BE. The dielectric layer DL may be disposed or arranged between the first electrode BE and the second electrode UE. The metal oxide layer MO may be disposed or arranged between the dielectric layer DL and the second electrode UE. The first electrode BE, the second electrode UE, the dielectric layer DL and the metal oxide layer MO in combination may constitute a capacitor. It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section.

The substrate 100 may be a single-crystalline silicon substrate or a silicon-on-insulator (SOI) substrate. Even though not shown in the drawings, an interlayer insulating layer, a transistor, a contact plug and an interconnection line may be disposed or arranged between the substrate 100 and the first electrode BE.

The first electrode BE may be referred to as a lower electrode. The first electrode BE may include a poly-silicon layer doped with dopants, a silicon-germanium layer doped with dopants, a metal nitride layer (e.g., a titanium nitride layer), and/or a metal layer (e.g., tungsten, copper, or aluminum). As used herein, the term "and/or" includes any and all combinations of one or more of the associated listed items. For example, the first electrode BE may be a layer formed of titanium nitride.

The dielectric layer DL may include silicon oxide, a metal oxide (e.g., hafnium oxide, zirconium oxide, aluminum oxide, lanthanum oxide, tantalum oxide, and/or titanium oxide), and/or a dielectric material having a perovskite structure (e.g., $SrTiO_3$ (STO), $(Ba,Sr)TiO_3$ (BST), $BaTiO_3$, PZT, and/or PLZT).

The metal oxide layer MO may include a metal oxide, for example, titanium oxide ($TiO_x$).

The second electrode UE may be referred to as an upper electrode. A thickness TK of the second electrode UE may be about 500 Å or less. For example, the thickness TK of the second electrode UE may be about 100 Å. The second electrode UE may include an A-metal, nitrogen, and a B-metal.

The second electrode UE may include a first layer 31, a second layer 32, and a third layer 33. The first layer 31 may be disposed or arranged adjacent to the metal oxide layer MO. The third layer 33 may be disposed or arranged on the first layer 31 with the second layer 32 interposed therebetween. A top surface of the first layer 31 may be in physical contact with a bottom surface of the second layer 32. A top surface of the second layer 32 may be in physical contact with a bottom surface of the third layer 33.

Concentrations of the A-metal and the nitrogen in the first layer 31 may be highest in the second electrode UE. As used herein, the concentrations may be expressed as an atomic percent (at %).

The B-metal may not exist in the first layer 31 or may have a concentration much lower than the concentration of the A-metal in the first layer 31. The concentration of the A-metal of the first layer 31 may be substantially constant throughout the first layer 31.

A concentration of the B-metal in the third layer 33 may be highest in the second electrode UE. The A-metal and the nitrogen may not exist in the third layer 33 or may have concentrations much lower than the concentration of the B-metal in the third layer 33. The concentration of the B-metal of the third layer 33 may be substantially constant throughout the third layer 33. The concentration of the B-metal in the third layer 33 may be about 100 at % per unit volume.

A thickness of the third layer 33 may be greater than 0Å and equal to or less than 50 Å. For example, the thickness of the third layer 33 may be about 30 Å. In some embodiments, the thickness of the third layer 33 may be adjusted differently from the above value.

The second layer 32 may include the A-metal, the nitrogen, and the B-metal. A concentration of the A-metal in a portion of the second layer 32 close to the first layer 31 may be higher than a concentration of the A-metal in another portion of the second layer 32 close to the third layer 33. A concentration of the B-metal in a portion of the second layer 32 close to the third layer 33 may be higher than a concentration of the B-metal in another portion of the second layer 32 close to the first layer 31.

A concentration of the A-metal of the second layer 32 may decrease from the first layer 31 toward the third layer 33. A concentration of the B-metal of the second layer 32 may increase from the first layer 31 toward the third layer 33. In other words, a concentration gradient of the A-metal of the second layer 32 and a concentration gradient of the B-metal of the second layer 32 may have different signs from each other.

The concentration of the A-metal in the first layer 31 may be equal to or greater than the concentration of the A-metal in the second layer 32. The concentration of the A-metal in the first layer 31 may be greater than the concentration of the A-metal in the third layer 33. The concentration of the B-metal in the third layer 33 may be equal to or greater than the concentration of the B-metal in the second layer 32. The concentration of the B-metal in the third layer 33 may be greater than the concentration of the B-metal in the first layer 31.

The B-metal may not exist at an interface between the second electrode UE and the metal oxide layer MO.

The A-metal and the B-metal may include different metals from each other. The B-metal may be a metal of which a work function is greater than a work function of a nitride of the A-metal (i.e., a work function of an A-metal nitride). A difference between the work function of the B-metal and the work function of the A-metal nitride may be 0.5 eV or more.

The work function is an energy value needed to remove an electron in a material from a Fermi level to a point in the vacuum and constitutes a property of the material. For example, the A-metal may be titanium, the A-metal nitride may be titanium nitride, and the B-metal may be nickel. A work function of the titanium nitride may range from about 4.30 eV to about 4.65 eV, and a work function of the nickel may range from about 5.04 eV to about 5.35 eV.

Because the second electrode UE includes the B-metal having the relatively greater work function as compared with a case in which the second electrode UE is formed of only the A-metal nitride, an effective work function value of the second electrode UE may be increased. The effective work function may be a parameter determined (or adjusted) based on the kinds of materials of the second electrode UE, a shape of the second electrode UE, and/or a process of manufacturing the second electrode UE. The effective work function may be related to a leakage current in driving of the capacitor.

Figure 2:
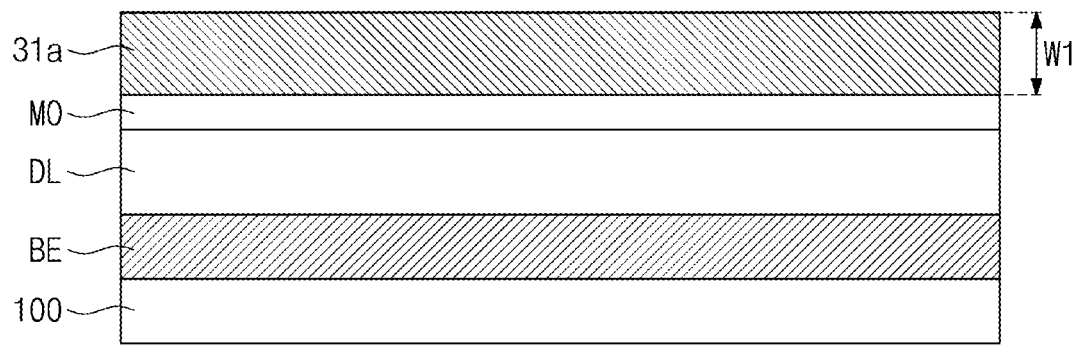
FIGS. 2 and 3 are cross-sectional views illustrating a method of manufacturing the semiconductor memory device of FIG. 1 according to some embodiments of the inventive concept.
Figure 3:
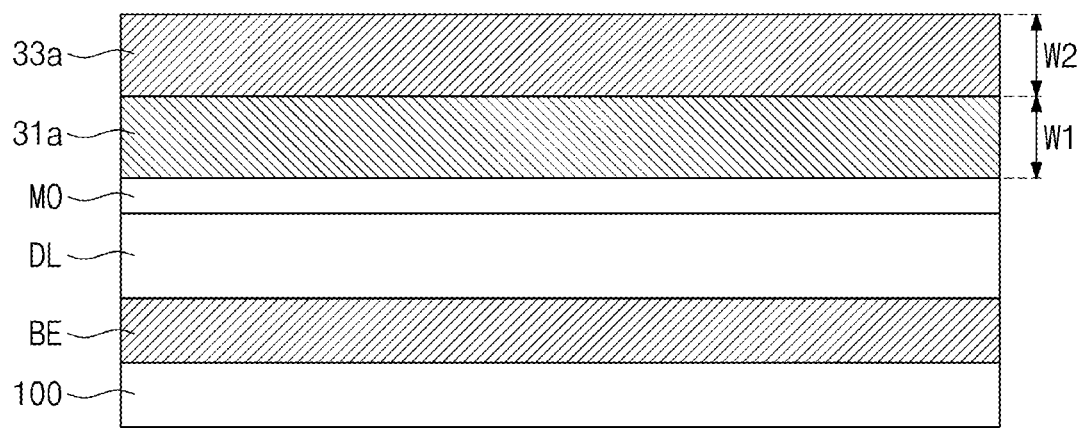

FIGS. 2 and 3 are cross-sectional views illustrating a method of manufacturing the semiconductor memory device of FIG. 1 according to some embodiments of the inventive concepts.

Referring to FIG. 2, a substrate 100 may be prepared. A first electrode BE may be formed on the substrate 100. The first electrode BE may be formed by, for example, an atomic layer deposition (ALD) method.

A dielectric layer DL and a metal oxide layer MO may be sequentially formed on the first electrode BE. The dielectric layer DL and the metal oxide layer MO may be formed by an ALD method.

An A-metal nitride layer 31a may be formed on the metal oxide layer MO. For example, the A-metal nitride layer 31a may be a titanium nitride layer. A thickness W1 of the A-metal nitride layer 31a may be about 50 Å or less. For example, the thickness W1 of the A-metal nitride layer 31a may be about 50 Å. The A-metal nitride layer 31a may be formed by an ALD method.

Referring to FIG. 3, a B-metal layer 33a may be formed on the A-metal nitride layer 31a. The B-metal layer 33a may be, for example, a nickel layer. A thickness W2 of the B-metal layer 33a may be about 50 Å or less. For example, the thickness W2 of the B-metal layer 33a may be about 30 Å. The B-metal layer 33a may be formed by an ALD method.

Referring again to FIG. 1, an annealing process may be performed. An A-metal and nitrogen in the A-metal nitride layer 31a may be diffused toward the B-metal layer 33a, and a B-metal in the B-metal layer 33a may be diffused toward the A-metal nitride layer 31a.

An intermediate layer including the A-metal, the nitrogen and the B-metal may be formed between the A-metal nitride layer 31a and the B-metal layer 33a by the diffusion of the A-metal, the nitrogen, and the B-metal. The A-metal nitride layer 31a, the intermediate layer, and the B-metal layer 33a after completion of the annealing process may correspond to a first layer 31, a second layer 32 and a third layer 33, respectively. Thus, a second electrode UE including the first layer 31, the second layer 32 and the third layer 33 may be formed.

Techniques capable of reducing a thickness of an upper electrode of a capacitor are being studied to increase integration density of semiconductor memory devices. When the thickness of the upper electrode of the capacitor is varied in a range of several nanometers to hundreds nanometers, an effective work function of the upper electrode may likewise be varied. When the thickness of the upper electrode is reduced, a capacitance of the capacitor may be increased, but the effective work function may be reduced to cause an increase in leakage current of the capacitor.

However, according to some embodiments of the inventive concept, a total thickness of the upper electrode may be reduced, and the effective work function of the upper electrode may be increased by depositing the nickel layer having a work function greater than that of titanium nitride on the titanium nitride layer and performing the annealing process. A capacitance of the capacitor according to some embodiments of the inventive concept may be increased by the reduction in the total thickness of the upper electrode, and the effective work function may also be increased to reduce a leakage current of the capacitor.

Figure 4:
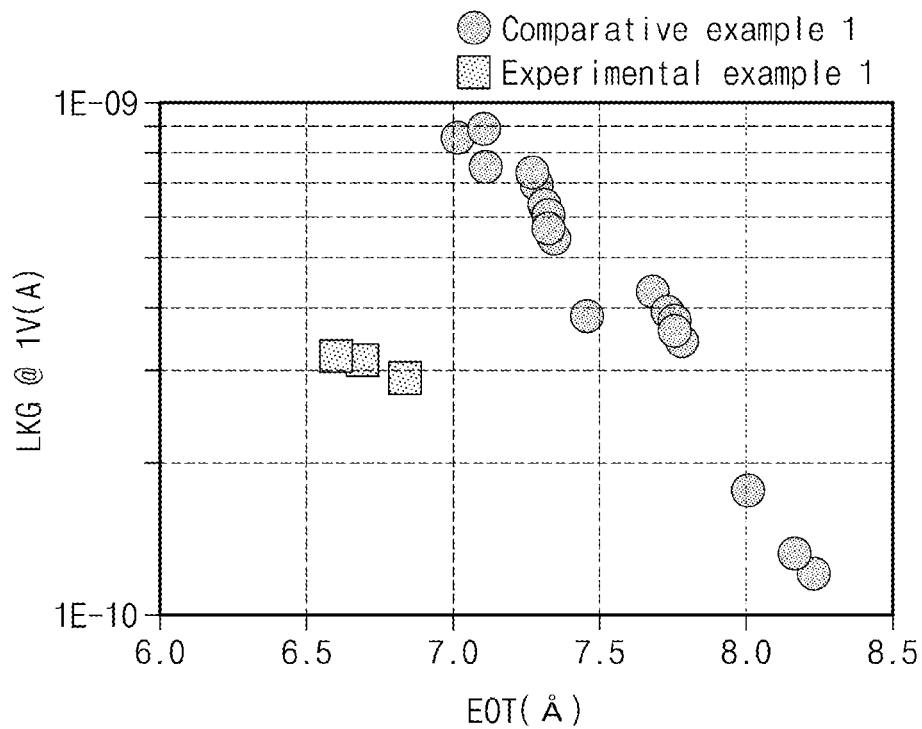
FIG. 4 is a graph showing leakage current amounts of semiconductor memory devices according to some embodiments of the inventive concept.

FIG. 4 is a graph showing leakage current amounts of semiconductor memory devices according to some embodiments of the inventive concept. In particular, FIG. 4 shows the amounts of leakage current measured when a driving voltage of 1V is applied to two different semiconductor memory devices.

An experimental example 1 is a semiconductor memory device including an upper electrode formed by forming a nickel layer on a titanium nitride layer and then performing an annealing process. A comparative example 1 is a semiconductor memory device including an upper electrode formed of only a titanium nitride layer. Leakage currents of the experimental example 1 and the comparative example 1 were measured. In FIG. 4, a horizontal axis represents an equivalent oxide thickness (EOT), and a vertical axis represents a measured amount of the leakage current.

Referring to FIG. 4, under the driving voltage, the amount of the leakage current of the comparative example 1 increases as the EOT decreases. The amount of the leakage current of the experimental example 1 is less than the amount of the leakage current of the comparative example 1 even though the EOT of the experimental example 1 is less than that of the EOT of the comparative example 1.

Figure 5:
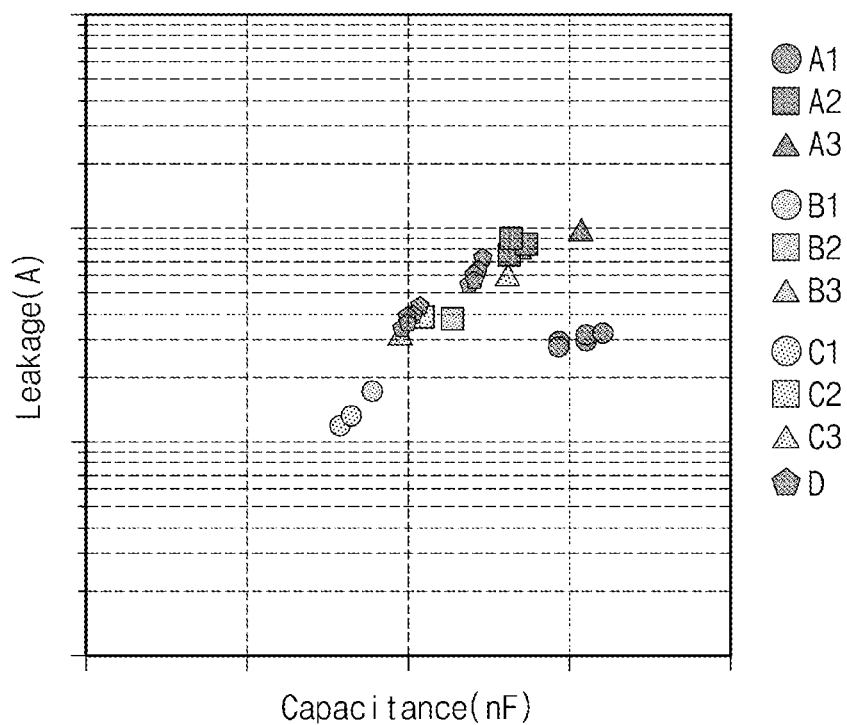
FIG. 5 is a graph showing a capacitance and a leakage current according to a thickness and a material of an upper electrode according to some embodiments of the inventive concept.

FIG. 5 is a graph showing a capacitance and a leakage current according to a thickness and a material of an upper electrode of a capacitor according to some embodiments of the inventive concept.

Nickel (Ni) layers of 30 Å, 50 Å and 70 Å were deposited on titanium nitride (TiN) layers in experimental examples A1, A2 and A3, respectively. Platinum (Pt) layers of 30 Å, 50 Å and 70 Å were deposited on titanium nitride (TiN) layers in comparative examples B1, B2 and B3, respectively. Aluminum (Al) layers of 30 Å, 50 Å and 70 Å were deposited on titanium nitride (TiN) layers in comparative examples C1, C2 and C3, respectively. In a comparative example D, only titanium nitride (TiN) was used as a material of an upper electrode and a thickness of the upper electrode was varied in a range of 30 Å to 50 Å.

Referring to FIG. 5, capacitances of the experimental examples A1 to A3 are greater than capacitances of the comparative examples B1 to B3, C1 to C3, and D. In addition, the amount of the leakage current of the experimental example A2 is less than those of other experimental examples and the comparative examples.

Figure 6:
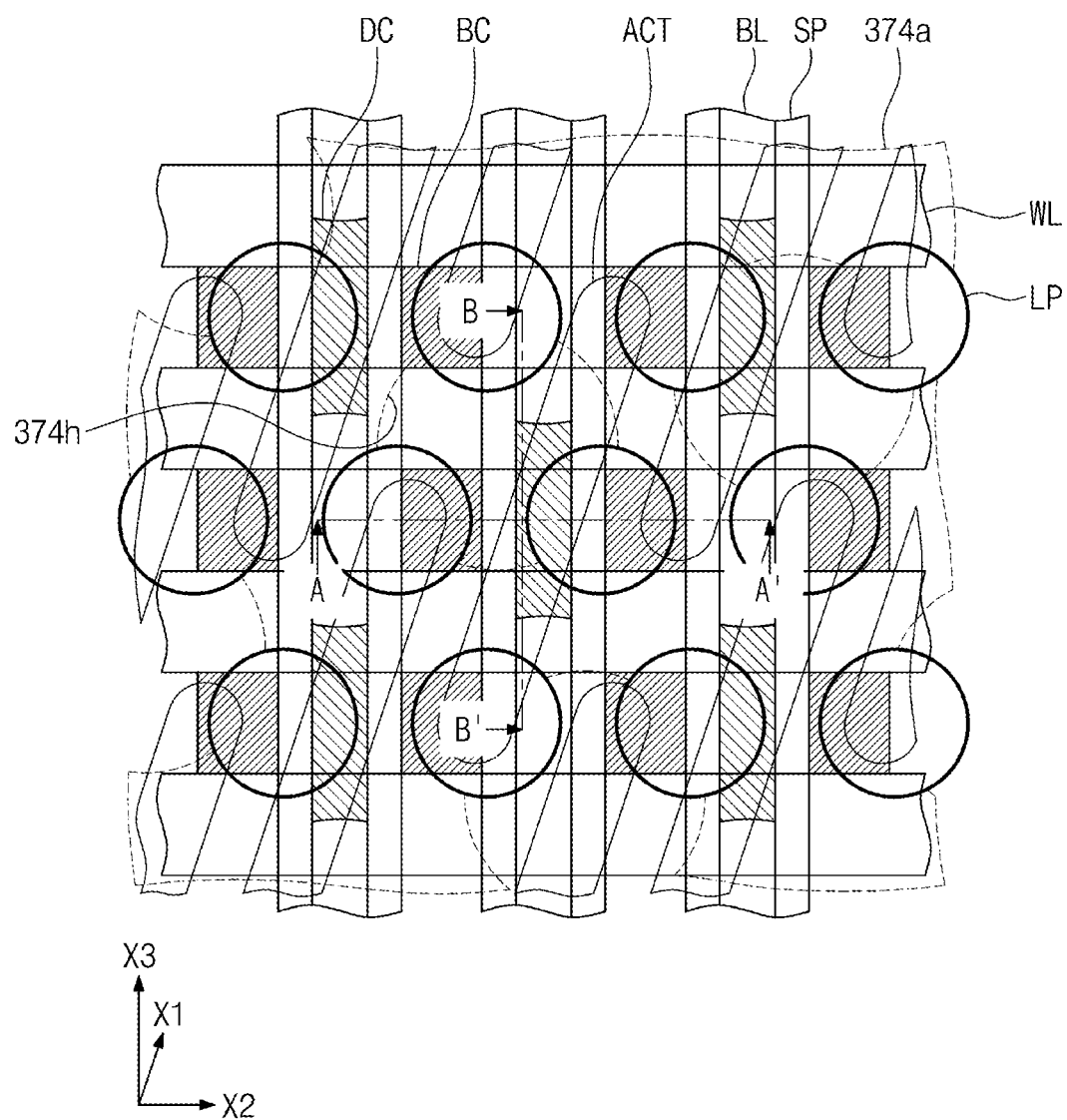
FIG. 6 is a plan view illustrating a semiconductor memory device according to some embodiments of the inventive concepts.
Figure 7:
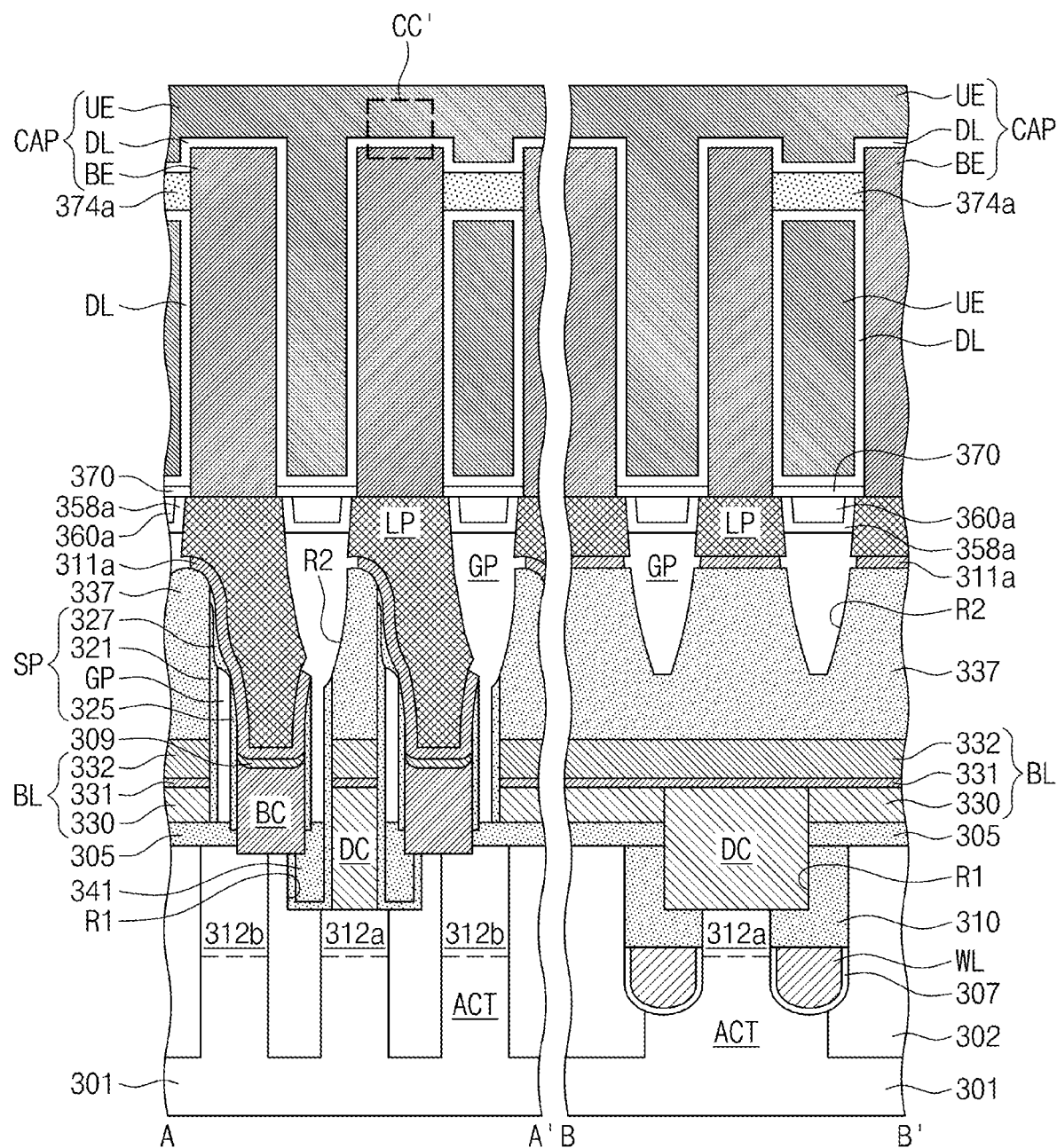
FIG. 7 is a cross-sectional view taken along lines A-A' and B-B' of FIG. 6.
Figure 8:
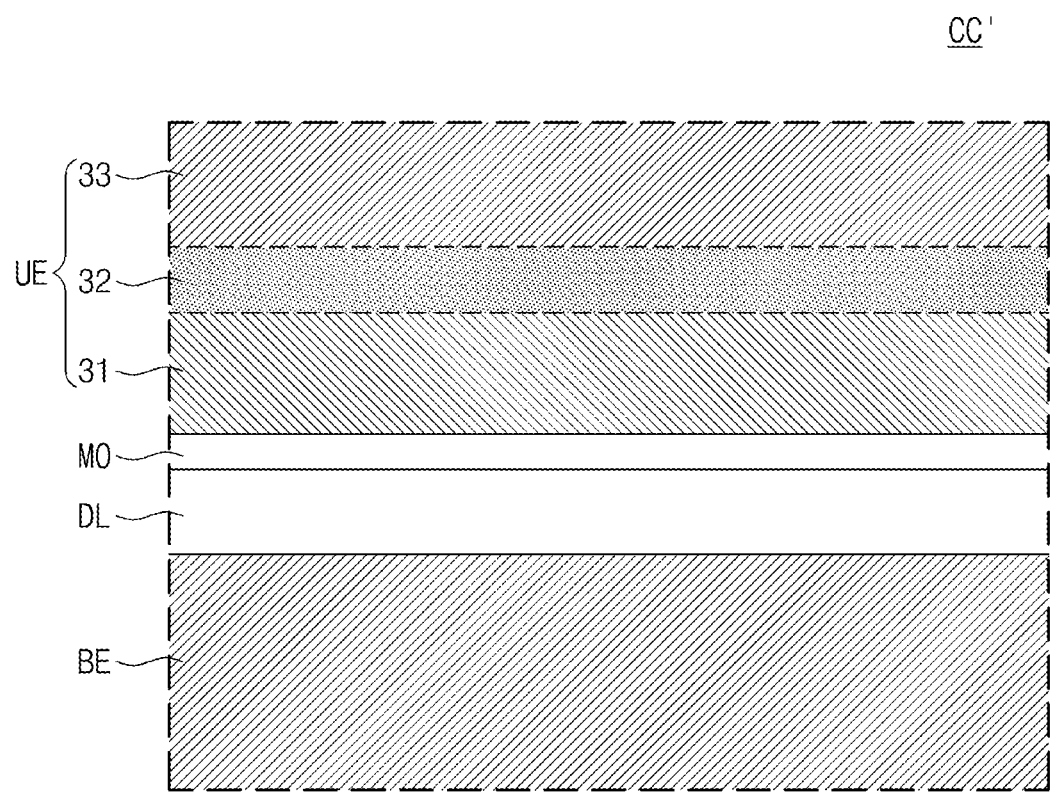
FIG. 8 is an enlarged view of a portion CC' of FIG. 7.

A detailed example of a semiconductor memory device including the upper electrode configured according to some embodiments of the inventive concept will be described hereinafter. FIG. 6 is a plan view illustrating a semiconductor memory device according to some embodiments of the inventive concepts. FIG. 7 is a cross-sectional view taken along lines A-A' and B-B' of FIG. 6. FIG. 8 is an enlarged view of a portion CC' of FIG. 7.

Referring to FIGS. 6 and 7, a device isolation pattern 302 may be disposed in a substrate 301 to define active portions ACT. Each of the active portions ACT may have an isolated shape when viewed in a plan view of the semiconductor memory device. Each of the active portions ACT may have a bar shape extending in a first direction X1 when viewed in a plan view of the semiconductor memory device. Each of the active portions ACT may correspond to a portion of the substrate 301, which is surrounded or bordered by the device isolation pattern 302 when viewed in a plan view of the semiconductor memory device.

The substrate 301 may include a semiconductor material. The active portions ACT may be arranged in parallel to each other in the first direction X1, and an end portion of one active portion ACT may be disposed or arranged adjacent to a center of another active portion ACT neighboring the one active portion ACT.

Word lines WL may intersect the active portions ACT. The word lines WL may be disposed or arranged in grooves formed in the device isolation pattern 302 and the active portions ACT. The word lines WL may be parallel to a second direction X2 intersecting the first direction X1. The word lines WL may be formed of a conductive material. A gate dielectric layer 307 may be disposed or arranged between each of the word lines WL and an inner surface of each of the grooves. Even though not shown in the drawings, bottoms of the grooves may be relatively deep in the device isolation pattern 302 and may be relatively shallow in the active portions ACT. The gate dielectric layer 307 may include a thermal oxide, silicon nitride, silicon oxynitride, and/or a high-k dielectric material. Bottom surfaces of the word lines WL may be rounded.

A first doped region 312a may be disposed or arranged in each of the active portions ACT between a pair of the word lines WL, and a pair of second doped regions 312b may be disposed or arranged in both edge regions of each of the active portions ACT, respectively. The first and second doped regions 312a and 312b may be doped with, for example, N-type dopants.

The first doped regions 312a may correspond to a common drain region, and the second doped regions 312b may correspond to source regions. Each of the word lines WL and the first and second doped regions 312a and 312b adjacent thereto may constitute a transistor. Because the word lines WL are disposed or arranged in the grooves, a channel length of a channel region under the word line WL may be increased in a limited planar area. Thus, a short channel effect may be reduced or minimized.

Top surfaces of the word lines WL may be lower than top surfaces of the active portions ACT in the cross-sectional view of FIG. 7. Word line capping patterns 310 may be disposed or arranged on the word lines WL, respectively. The word line capping patterns 310 may have line shapes extending in a longitudinal direction of the word lines WL and may be on and fully cover the top surfaces of the word lines WL. The word line capping patterns 310 may be in and at least partially fill the grooves on the word lines WL. The word line capping patterns 310 may be formed of, for example, silicon nitride.

An interlayer insulating pattern 305 may be disposed or arranged on the substrate 301. The interlayer insulating pattern 305 may be formed of a single or multi-layer structure including a silicon oxide layer, a silicon nitride layer, and/or a silicon oxynitride layer. The interlayer insulating pattern 305 may be on and at least partially cover end portions of two active portions ACT adjacent to each other.

Upper portions of the substrate 301, the device isolation pattern 302, and the word line capping pattern 310 may be partially recessed to form a first recess region R1. The first recess region R1 may have a mesh shape when viewed in a plan view. A sidewall of the first recess region R1 may be aligned with a sidewall of the interlayer insulating pattern 305.

Bit lines BL may be disposed or arranged on the interlayer insulating pattern 305. The bit lines BL may intersect the word line capping patterns 310 and the word lines WL. As illustrated in FIG. 6, the bit lines BL may be parallel to a third direction X3 intersecting the first and second directions X1 and X2.

Each of the bit lines BL may include a bit line poly-silicon pattern 330, a bit line ohmic pattern 331, and a bit line metal-containing pattern 332, which are sequentially stacked. The bit line poly-silicon pattern 330 may include poly-silicon, which may or may not be doped with dopants. The bit line ohmic pattern 331 may include a metal silicide layer. The bit line metal-containing pattern 332 may include a metal (e.g., tungsten, titanium, and/or tantalum) and/or a conductive metal nitride (e.g., titanium nitride, tantalum nitride, and/or tungsten nitride). A bit line capping pattern 337 may be disposed or arranged on each of the bit lines BL. The bit line capping patterns 337 may be formed of an insulating material, such as silicon nitride.

Bit line contacts DC may be disposed or arranged in the first recess region R1 intersecting the bit lines BL. The bit line contacts DC may include poly-silicon, which may or may not be doped with dopants. In the cross-sectional view taken along the line B-B' of FIG. 7, a sidewall of the bit line contact DC may be in physical contact with a sidewall of the interlayer insulating pattern 305.

In the plan view of FIG. 6, the sidewall of the bit line contact DC, which is in physical contact with the interlayer insulating pattern 305, may be concave. The bit line contact DC may electrically connect the first doped region 312a to the bit line BL.

A lower filling insulation pattern 341 may be disposed or arranged in the first recess region R1, which does not include the bit line contact DC. The lower filling insulation pattern 341 may be formed of a single or multi-layer structure including a silicon oxide layer, a silicon nitride layer, and/or a silicon oxynitride layer.

Storage node contacts BC may be disposed or arranged between a pair of the bit lines BL adjacent to each other. The storage node contacts BC may be spaced apart from each other. The storage node contacts BC may include poly-silicon, which may or may not be doped with dopants. Top surfaces of the storage node contacts BC may be concave. An insulating pattern (not shown) may be disposed or arranged between the storage node contacts BC between the bit lines BL.

A bit line spacer SP may be disposed or arranged between the bit line BL and the storage node contact BC. The bit line spacer SP may include a first sub-spacer 321 and a second sub-spacer 325, which are spaced apart from each other by a gap region GP. The gap region GP may be referred to as an air gap region. The first sub-spacer 321 may be on and at least partially cover a sidewall of the bit line BL and a sidewall of the bit line capping pattern 337. The second sub-spacer 325 may be adjacent to the storage node contact BC. The first sub-spacer 321 and the second sub-spacer 325 may include the same material. For example, the first sub-spacer 321 and the second sub-spacer 325 may include silicon nitride.

A bottom surface of the second sub-spacer 325 may be lower than a bottom surface of the first sub-spacer 321 in the cross-sectional view of FIG. 7. A height of a top end of the second sub-spacer 325 may be lower than a height of a top end of the first sub-spacer 321 in the cross-sectional view of FIG. 7. Thus, a margin of forming a landing pad LP may be increased, and disconnection between the landing pad LP and the storage node contact BC may be prevented or the risk thereof reduced.

The first sub-spacer 321 may extend to be on and at least partially cover a sidewall of the bit line contact DC and a sidewall and a bottom surface of the first recess region R1. The first sub-spacer 321 may be disposed or arranged between the bit line contact DC and the lower filling insulation pattern 341, between the word line capping pattern 310 and the lower filling insulation pattern 341, between the substrate 301 and the lower filling insulation pattern 341, and between the device isolation pattern 302 and the lower filling insulation pattern 341.

A storage node ohmic layer 309 may be disposed or arranged on the storage node contact BC. The storage node ohmic layer 309 may include a metal silicide. A diffusion barrier pattern 311a may conformally be on and at least partially cover the storage node ohmic layer 309, the first and second sub-spacers 321 and 325, and the bit line capping pattern 337. The diffusion barrier pattern 311a may include a metal nitride, such as titanium nitride or tantalum nitride. A landing pad LP may be disposed or arranged on the diffusion barrier pattern 311a. The landing pad LP may be formed of a metal-containing material, such as tungsten. An upper portion of the landing pad LP may be on and at least partially cover a top surface of the bit line capping pattern 337 and may have a width greater than that of the storage node contact BC. A center of the landing pad LP may be offset from a center of the storage node contact BC in the second direction X2. A portion of the bit line BL may vertically overlap the landing pad LP in the cross-sectional view of FIG. 7. One upper sidewall of the bit line capping pattern 337 may overlap the landing pad LP and may be at least partially covered with a third sub-spacer 327.

A second recess region R2 may be formed at another upper sidewall of the bit line capping pattern 337.

A first capping pattern 358a may be on and at least partially cover upper sidewalls of adjacent landing pads LP and may connect the adjacent landing pads LP to each other. The first capping pattern 358a may have a substantially uniform thickness.

The first capping pattern 358a may have a liner shape, and a space surrounded or bordered thereby may be at least partially filled with a second capping pattern 360a. Each of the first and second capping patterns 358a and 360a may independently include a silicon nitride layer, a silicon oxide layer, a silicon oxynitride layer, and/or a porous layer. A porosity of the first capping pattern 358a may be greater than a porosity of the second capping pattern 360a. Top surfaces of the first and second capping patterns 358a and 360a may be coplanar with top surfaces of the landing pads LP.

The gap region GP between the first and second subspacers 321 and 325 may extend between the landing pads LP. A bottom surface of the first capping pattern 358a may be exposed by the gap region GP. The gap region GP may extend toward the diffusion barrier pattern 311a. A sidewall of the diffusion barrier pattern 311a may be recessed between the landing pad LP and the bit line capping pattern 337. The top surface of the bit line capping pattern 337 and a bottom surface of the landing pad LP may be partially exposed by the gap region GP.

Lower electrodes BE may be disposed or arranged on the landing pads LP, respectively. The lower electrode BE may include poly-silicon doped with dopants, a metal nitride (e.g., titanium nitride), and/or a metal (e.g., tungsten, aluminum, or copper). The lower electrode BE may have a solid cylinder shape or a hollow cylinder or cup shape. A support pattern 374a may be disposed between upper sidewalls of the lower electrodes BE adjacent to each other. The support pattern 374a may include an insulating material, such as silicon nitride, silicon oxide, and/or silicon oxynitride. A support hole 374h may at least partially expose sidewalls of the lower electrodes BE adjacent to each other.

The top surfaces of the first and second capping patterns 358a and 360a between the lower electrodes BE may have an etch stop layer 370 thereon and be at least partially covered by the etch stop layer 370. For example, the etch stop layer 370 may include an insulating material, such as silicon nitride, silicon oxide, and/or silicon oxynitride. A dielectric layer DL may be on and at least partially cover surfaces of the lower electrodes BE and a surface of the support pattern 374a.

Referring to FIGS. 7 and 8, an upper electrode UE may be disposed or arranged on the dielectric layer DL. A metal oxide layer MO may be disposed between the dielectric layer DL and the upper electrode UE. The upper electrode UE of FIGS. 7 and 8 may be the same as or similar to the upper electrode (second electrode UE) described with reference to FIG. 1.

According to some embodiments of the inventive concepts, because the upper electrode of the capacitor includes nickel (Ni), the leakage current of the capacitor may be reduced and the capacitance of the capacitor may be increased. As a result, a semiconductor memory device with improved reliability may be realized.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor memory device comprising:
a capacitor on a substrate, the capacitor comprising:
a first electrode;
a second electrode on the first electrode, the second electrode comprising a first layer, a second layer, and a third layer; and
a dielectric layer between the first electrode and the second electrode,
wherein the first layer is adjacent to the dielectric layer, and the third layer is spaced apart from the first layer with the second layer interposed therebetween,
wherein the first layer includes titanium nitride (TiN),
wherein the second layer includes nickel (Ni), titanium (Ti), and nitrogen (N), and
wherein the third layer includes nickel.

2. The semiconductor memory device of claim 1, wherein a concentration of titanium in the first layer is higher than a concentration of titanium in the third layer.

3. The semiconductor memory device of claim 2, wherein a concentration of nickel in the second layer is lower than the concentration of nickel in the third layer, and
wherein a concentration of titanium in the second layer is lower than the concentration of titanium in the first layer.

4. The semiconductor memory device of claim 3, wherein a concentration of nickel in a first portion of the second layer adjacent to the third layer is higher than a concentration of nickel in a second portion of the second layer adjacent to the first layer, and
wherein a concentration of titanium in the second portion of the second layer is higher than a concentration of titanium in the first portion of the second layer.

5. The semiconductor memory device of claim 3, wherein a thickness of the third layer is greater than 0Å and equal to or less than 50Å.

6. The semiconductor memory device of claim 3, wherein a top surface of the first layer is in physical contact with a bottom surface of the second layer, and
wherein a top surface of the second layer is in physical contact with a bottom surface of the third layer.

7. The semiconductor memory device of claim 1, further comprising:
a metal oxide layer between the dielectric layer and the second electrode,
wherein the metal oxide layer includes titanium oxide.

8. The semiconductor memory device of claim 7, wherein an interface between the metal oxide layer and the second electrode is free of nickel.

9. A semiconductor memory device comprising:
a capacitor on a substrate, the capacitor comprising:
a first electrode;
a second electrode on the first electrode, the second electrode comprising a first layer including an A-metal and nitrogen, a second layer, and a third layer including a B-metal; and
a dielectric layer disposed between the first electrode and the second electrode,
wherein the first layer is adjacent to the dielectric layer, and the third layer is spaced apart from the first layer with the second layer interposed therebetween,
wherein a work function of the B-metal is greater than a work function of an A-metal nitride.

10. The semiconductor memory device of claim 9, wherein the A-metal nitride is titanium nitride, and
wherein the B-metal is nickel.

11. The semiconductor memory device of claim 10, wherein a top surface of the first layer is in physical contact with a bottom surface of the second layer, and
wherein a top surface of the second layer is in physical contact with a bottom surface of the third layer.

12. The semiconductor memory device of claim 9, wherein a difference between the work function of the B-metal and the work function of the A-metal nitride is at least 0.5 eV.

13. The semiconductor memory device of claim 9, wherein the second layer includes the A-metal, nitrogen, and the B-metal.

14. The semiconductor memory device of claim 13, wherein a concentration of the B-metal in a first portion of the second layer adjacent to the third layer is higher than a concentration of the B-metal in a second portion of the second layer adjacent to the first layer, and wherein a concentration of the A-metal in the second portion of the second layer is higher than a concentration of the A-metal in the first portion of the second layer.

15. The semiconductor memory device of claim 9, wherein the first electrode includes an A-metal nitride.

16. The semiconductor memory device of claim 9, further comprising:

a support pattern in physical contact with sidewall so the first electrode.

17. The semiconductor memory device of claim 16, wherein the dielectric layer is on a surface of the support pattern.

18. The semiconductor memory device of claim 9, wherein a concentration of the A-metal has a maximum value in the first layer, and a concentration of the B-metal mas a maximum value in the third layer.

19. The semiconductor memory device of claim 9, further comprising:

a metal oxide layer between the dielectric layer and the second electrode.

20. The semiconductor memory device of claim 19, wherein the metal oxide layer includes titanium oxide, and wherein an interface between the metal oxide layer and the second electrode is free of nickel.

* * * * *